United States Patent [19]

Burnham et al.

[11] Patent Number: 4,585,491
[45] Date of Patent: Apr. 29, 1986

[54] WAVELENGTH TUNING OF QUANTUM WELL LASERS BY THERMAL ANNEALING

[75] Inventors: Robert Burnham, Palo Alto, Calif.; Nick Holonyak, Jr., Urbana, Ill.

[73] Assignee: Xerox Corporation, Stamford, Conn.

[21] Appl. No.: 528,766

[22] Filed: Sep. 2, 1983

[51] Int. Cl.$^4$ .................. H01L 21/265; H01L 21/208
[52] U.S. Cl. ...................................... 148/1.5; 29/574; 29/569 L; 29/576 B; 29/576 T; 148/175; 148/187; 357/91; 372/45
[58] Field of Search .................. 148/1.5, 187, 175; 29/576 B, 576 T, 569 L, 574; 372/45; 357/91

[56] References Cited

U.S. PATENT DOCUMENTS

| | | | |
|---|---|---|---|
| 3,312,910 | 4/1967 | Offner | 331/94.5 M |
| 3,482,189 | 12/1969 | Fenner | 332/7.51 |
| 3,483,397 | 12/1969 | Miller et al. | 307/312 |
| 3,523,045 | 8/1970 | Suzuki et al. | 148/33.1 |
| 4,071,383 | 1/1978 | Nagata et al. | 148/175 |
| 4,312,681 | 1/1982 | Rupprecht et al. | 148/1.5 |
| 4,338,577 | 7/1982 | Sato et al. | 372/36 |
| 4,421,577 | 12/1983 | Spicer | 148/187 |
| 4,468,850 | 9/1984 | Liau et al. | 29/569 L |

OTHER PUBLICATIONS

Badawi et al. *Electronic Letts.* 20 (1984) 125.
Kuzuhara et al. *Appl. Phys. Letts.* 41 (1982) 755.
Matsuura et al. *Jap. Jour. Appl. Phys.* 21 (1982) 23.
L. L. Chang et al., "Interdiffusion Between GaAs & AlAs" *Applied Physics Letters*, vol. 29(3), pp. 138-141 (Aug. 1, 1976).
Asbeck et al., "Application of Thermal Pulse Annealing to Ion-Implanted . . . Transistors", IEEE E.D.L., vol. EDL-4(4), pp. 81-83, (4/83).
H. A. Bomke et al., "Annealing of Ion-Implanted Silicon by an Incoherent Light Pulse" Applied Physics Letters, vol. 33(11) pp. 955-957 (12/1/78).
Juh Tzeng Lue, "Arc Annealing of BF$^{+2}$ Implanted Silicon by a Short Pulse Flash Lamp", *Applied Physics Letters*, vol. 36(1), pp. 73-76 (1/1/80).
B. Y. Tsaur et al., "Transient Annealing of . . . Using a Graphic Strip Heater", *Applied Physics Letters*, vol. 39(1), pp. 93-95 (7/1/81).

*Primary Examiner*—Upendra Roy
*Attorney, Agent, or Firm*—W. Douglas Carothers, Jr.

[57] ABSTRACT

The method of tuning the wavelength of a quantum well laser to a shorter emission wavelength is accomplished by the step of thermal annealing the laser for a prescribed period of time, the length of the period and the temperature of annealing being based upon what primary emission wavelength is desired. For good results, the annealing is conducted in an elemental anti-outdiffusion environment or the laser structure to be annealed is encapsulated so that any outdiffusion of laser elemental constituents is discouraged during thermal annealing. In an exemplary illustration of the invention, laser heterostructures of the GaAl/GaAlAs regime are utilized and annealed for several hours in an As environment to selectively reduce the emission wavelength by as much as 200 Å or more. The As environment prevents the outdiffusion of As from the GaAl/GaAlAs heterostructure during thermal annealing, elemental As having the lowest temperature of vaporization of elemental Ga, Al and As. High temperature annealing above this temperature may tend to drive elemental As from the heterostructure thereby changing its operating characteristics. Thermal annealing may be carried out in an annealing furnace, generally sealed in a quartz ampoule, or in a thermal pulse annealing system wherein properly prepared wafer samples may be alternately heated uniformly for prescribed periods of time at predetermined temperatures and periodically checked to determine the amount emission wavelength shift as compared to the set emission wavelength desired to be achieved for the laser.

24 Claims, 15 Drawing Figures

WAVELENGTH TUNING OF QUANTUM WELL LASERS BY THERMAL ANNEALING

BACKGROUND OF THE INVENTION

This invention relates to semiconductor lasers and more particularly to single and multiple quantum well lasers that may have their operating wavelength tuned to a shorter wavelength for particular applications requiring a principle operating frequency or emission wavelength within acceptable tolerances.

Semiconductor lasers are used in a wide variety of applications requiring desired and fairly precise intensity, optical output power and wavelength of operation. In fabricating a semiconductor laser by available epitaxial processes, it is not possible to know precisely what the predominant emission wavelength will be in the wavelength gain spectra of the laser. In the fabrication of quantum well lasers by metalorganic chemical vapor deposition (MO-CVD), it is possible to design the thickness of the active region comprising a single well or multiple wells and provide an operating wavelength within a particular range of predominant wavelengths, e.g., within 100 Å to 300 Å.

Attempts have been made to design semiconductor lasers in such a manner that during their epitaxial growth various schemes can be introduced to hopefully obtain, within a reasonable tolerance, the desired emission wavelength. One such scheme, as indicated, is a predetermination of the thickness of the quantum well or wells and its composition, e.g., GaAs or $Ga_{1-x}Al_xAs$ where x is fairly small. Another scheme is preselecting a dopant profile for growth of the multiple layers comprising the laser structure. A further scheme is the inclusion of a grating, such as in a distributed feedback (DFB) laser and a distributed Bragg reflector (DBR) laser, wherein the grating period is chosen to obtain the desired emission wavelength from the wavelength gain spectra.

While these schemes provide an emission wavelength within a band of potential wavelengths, it is not possible, from a practical point of view, to provide a desired emission wavelength within, for example, ±10 Å. This is particularly true because it is not known from the fabrication of one laser wafer run to the next run exactly what the resultant laser characteristics may actually be, principally due to the nonpredicability, in the fullest sense, of the interaction of the different process parameters and slight changes thereof occurring in the epitaxial processing.

What is needed is some process whereby the desired emission wavelength of the laser may be adjusted after laser fabrication.

One manner suggested for wavelength tuning of semiconductor lasers after fabrication is controllably altering the wavelength by applying a force to the laser structure, such as a mechanical stress in the form of hydrostatic pressure as taught in U.S. Pat. No. 3,482,189 or in the form of a sequentially applied current/voltage pulse scheme as taught in U.S. Pat. No. 3,312,910.

While these methods of wavelength alteration of lasers by subjecting the laser structure to an external force will vary the principal wavelength, they are not practical from the standpoint of permanent wavelength adjustment or change.

SUMMARY OF THE INVENTION

According to this invention, the method of tuning the wavelength of a quantum well laser to a shorter emission wavelength is accomplished by the step of thermal annealing the laser for a prescribed period of time, the length of the period and the temperature of annealing being based upon what primary emission wavelength is desired. For good results, the annealing is conducted in an elemental anti-outdiffusion environment or the laser structure to be annealed is encapsulated so that any outdiffusion of laser elemental constituents is discouraged during thermal annealing. In the case of an elemental anti-outdiffusion environment, the rate of annealing may also be varied by changing the overpressure of the elemental antioutdiffusion environment.

In an exemplary illustration of the invention, laser heterostructures of the GaAl/GaAlAs regime are utilized and annealed for several hours in an As environment to selectively reduce the emission wavelength by as much as 200 Å or more. The As environment prevents the outdiffusion of As from the GaAl/GaAlAs heterostructure during thermal annealing, elemental As having the lowest temperature of vaporization of elemental Ga, Al and As. High temperature annealing may tend to drive elemental As from the heterostructure thereby changing its operating characteristics.

Thermal annealing may be carried out in an annealing furnace, generally sealed in a quartz ampoule, or in a thermal pulse annealing system wherein properly prepared samples may be alternately heated uniformly for prescribed periods of time at predetermined temperatures and periodically checked to determine the amount emission wavelength shift as compared to the set emission wavelength desired to be achieved for the laser.

Other objects and attainments together with a fuller understanding of the invention will become apparent and appreciated by referring to the following description and claims taken in conjunction with the accompanying drawings.

DETAILED DESCRIPTION OF PREFERRED EMBODIMENTS

1. Photopumped Single Quantum Well Laser

Figure 1:
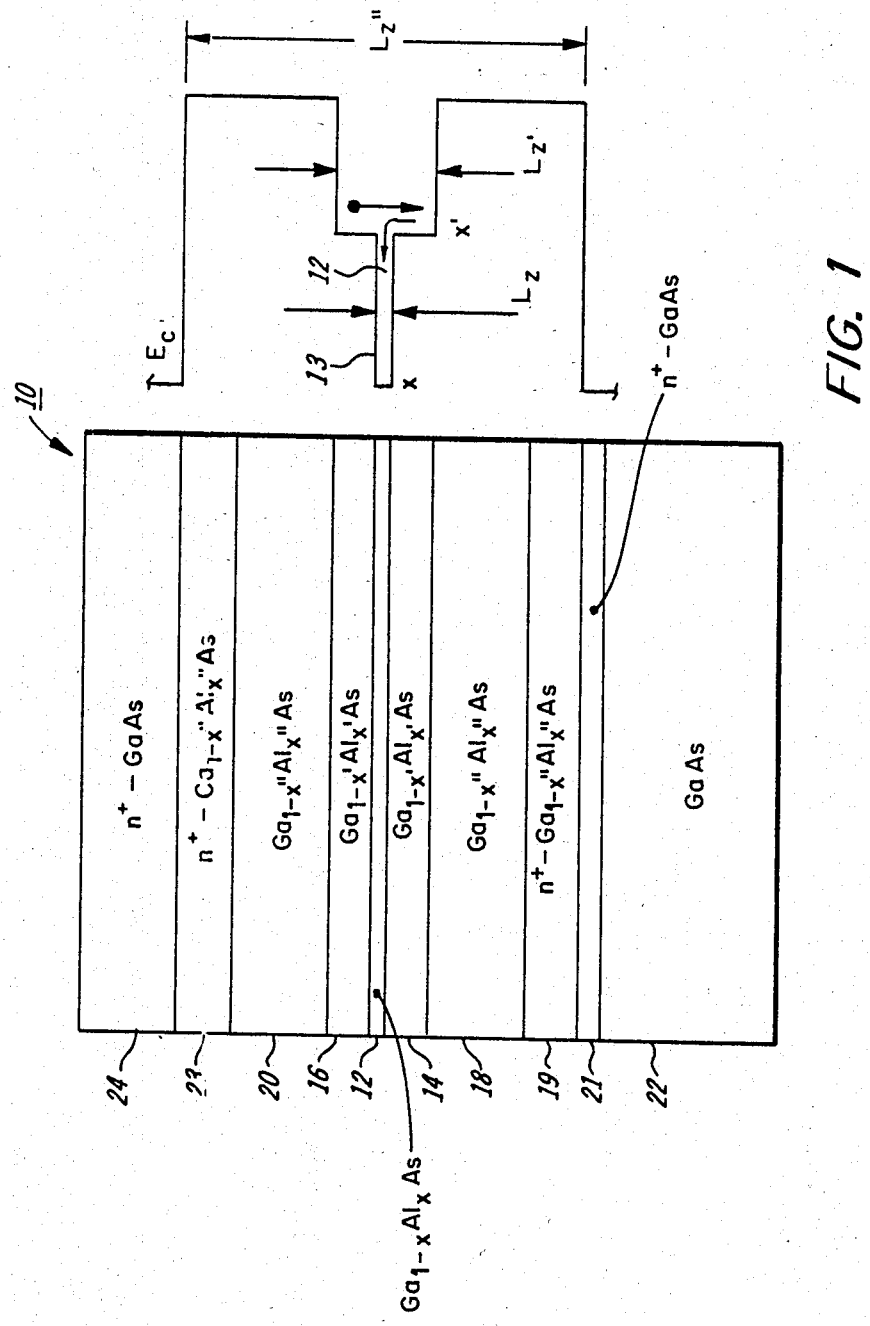
FIG. 1 is a cross-sectional view of an undoped single quantum well photopumped laser and accompanying energy band profile upon which thermal annealing techniques of this invention are to be applied.

Reference is made to FIG. 1 wherein there is shown an undoped single quantum well photopumped laser 10 in enlarged scale and comprising a quantum well active region or layer 12 of $Ga_{1-x}Al_xAs$ where $x=0$ and the thickness, $L_z$, is within the range of 60 Å–80 Å, inner cladding layers 14 and 16 of $Ga_{1-x'}Al_{x'}As$ where $x'$ is approximately 0.30 and the thickness, $L_{z'}$, is about 0.13 μm, outer cladding layers 18, 19, 20 and 23 of $Ga_{1-x''}Al_{x''}As$, where $x''$ is approximately 0.85, and outer cladding layers 19 and 23 of $n+Ga_{1-x''}Al_{x''}As$ which are heavily doped with Se (approximately $10^{18}/cm^3$). However, the quantum well structure within the confines of cladding layers 18 and 20 is not doped. $L_{z''}$ is equal to about 1.63 μm.

Laser 10 is topped with a cap layer 24 of $n+GaAs$ for protection. Layers 12–20 are grown by MO-CVD on a GaAs substrate 22 by conventional methods known in the art. Substrate 22 may have an initially deposited buffer layer 21 of $n+GaAs$ also deposited by MO-CVD.

Cladding layers 14 and 16 function as a carrier reservoir and waveguide region for the laser 10.

The laser 10, when properly prepared, may be photopumped and achieves CW laser operation at equivalent current densities as low as $J_{eq}(th)$ less than 100 Å/cm² and an operating wavelength, for example, of about 8200 Å±100 Å.

One aspect relative to a properly prepared laser is that the cap layer 24 be removed prior to photopumping because this layer, being of GaAs, is highly radiation absorbing. As an alternative, cap layer 24 may be comprise of material that is not highly radiation absorbing but rather highly transmissive to the pumping radiation, e.g., $Ga_{1-x''}Al_{x''}As$ where $x''$ is approximately 0.85.

We adjust or change, in a practical manner, the primary emission wavelength of the laser 10 without an accompanying excessive increase in laser threshold requirement. For a quantum well laser with a small enough single quantum well active region 12, thermal annealing of the laser will shift the laser primary emission wavelength by layer interdiffusion, i.e., by interdiffusion of the Al-Ga barrier or interface between the quantum well region 12 and the cladding layers 14 and 16. As shown in FIG. 1 in the energy band profile, the single quantum well region 12 is a finite square shaped well 13. As depicted in dotted line in FIG. 3, the well 13 has several energy levels, three of which are shown, e.g., e1, e2 and e3. The Al-Ga interdiffusion by thermal annealing causes the initially finite square well 13 to become more parabolic-like shaped, converting the GaAs well 13 into a shallower $Ga_{1-x}Al_xAs$ well 15 shown in solid line in FIG. 3. This "shallowing" of the well shifts the confined particle electron and hole states to higher or lower energy levels as illustrated in FIG. 3.

Figure 3:
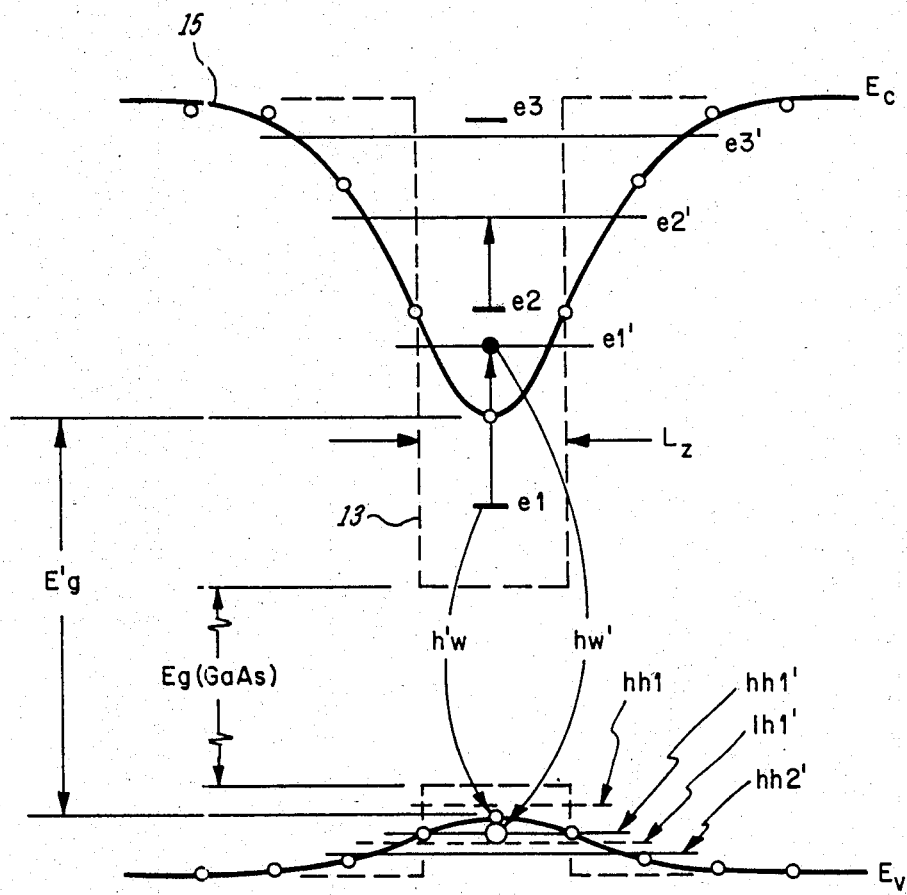
FIG. 3 is a graphic illustration of the energy band profile for the well structure shown in FIG. 1 for both before (dotted lines) and after (solid lines) thermal annealing illustrating the changes in the quantum well configuration and energy states occurring in the structure.

In FIG. 3, the bound states of the Pöschl-Teller potential are labeled "e" for electron states, "hh" for heavy hole states and "lh" for light hole states. An $n=1$ electron-to-heavy recombination transition (e→hh) emitting a photon of energy $h\omega = E_g(GaAs) + E_{e1} + E_{hh1}$ is depicted in FIG. 3.

After thermal annealing, energy levels e1 and e2 in the conduction band shift to higher energy levels e1' and e2' while the enery level e3 shifts to a lower energy level e3'.

In the case of the valence band, there is a corresponding shift of states from the lower energy levels hh1 (heavy hole), lh1 (light hole) and hh2 (light hole) to higher energy levels as depicted by levels hh1', lh1' and hh2'. Only the original valence band energy level hh1 is depicted in FIG. 3.

Thus, after thermal annealing, an $n=1$ electron-to-heavy hole recombination transition (e1'→hh1') emitting a photon of energy $h\omega' = E'_g(Ga_{1-x}Al_xAs) + E_{e1'} + E_{hh1'}$ is depicted in FIG. 3.

The concept of layer interdiffusion is not new in the art. As recognized by L. L. Chang and A. Koma, "Interdiffusion Between GaAs and AlAs", *Applied Physics Letters*, Vol. 29(3), pp. 138–141 (Aug. 1, 1976), diffusion anneals were carried out in as As-rich chamber at temperatures in excess of 850° C. on multi-thin layer structures comprising alternating layers of GaAs and AlAs. However, it is not known from the art of interdiffusion that thermal annealing of such structures may lead to a method to adjust the wavelength of a quantum well laser, to within a desired wavelength spectra or emission wavelength tolerance without excessively increasing the threshold requirement of the laser. Under the teachings of this invention, an emission wavelength of a quantum well laser may possibly be shifted as much as 1000 Å, e.g. from about 8200 Å to about 7300 Å with the threshold for the pumped laser remaining as low as $J_{eq}(th)$ being about 700 Å/cm².

2. Exemplifications of Wavelength Modified Photopumped Single Quantum Well Lasers Discussion now will turn to experimental data relating to the quantum well laser shown in FIG. 1.

For experimental purposes, several samples of laser 10 were initially prepared for photopumping and annealing by removal of the substrate 22 and cap layer 24 by selective etching. It is necessary to remove layer 24 because it is radiation absorbing of the pumping radiation, thereby preventing efficient pumping of the quantum well active region 12. The resultant samples, therefore, consisted of laser 10 within the confines of the thickness, $L_{z''}$. The lasers were then mounted under diamond on gold and annealed copper substrates for purposes of heat sinking, handling, testing and for photopumping with a cavity-dumped Argon laser operating at 5145 Å with a pulse repetition rate of approximately $10^6$ Hz and employing appropriate focusing optics.

The thermal annealing of the samples was carried out in an evacuated quartz ampoule in a vacuum of about $10^{-5}$ Torr. An overpressure of As was included in the ampoule for protection of the samples, in particular, to prevent the outdiffusion of As from the samples.

Samples were treated at different temperatures, e.g., 800°, 850°, 875°, 900°, 950° and 1000° C. for different time periods, e.g., anywhere from one to nine hours, to modify the single quantum well photopumped laser as depicted in FIG. 3. The particular representation in FIG. 3 is scaled for a single quantum well photopumped laser sample annealed for nine hours at a temperature of 875° C.

Figure 2:
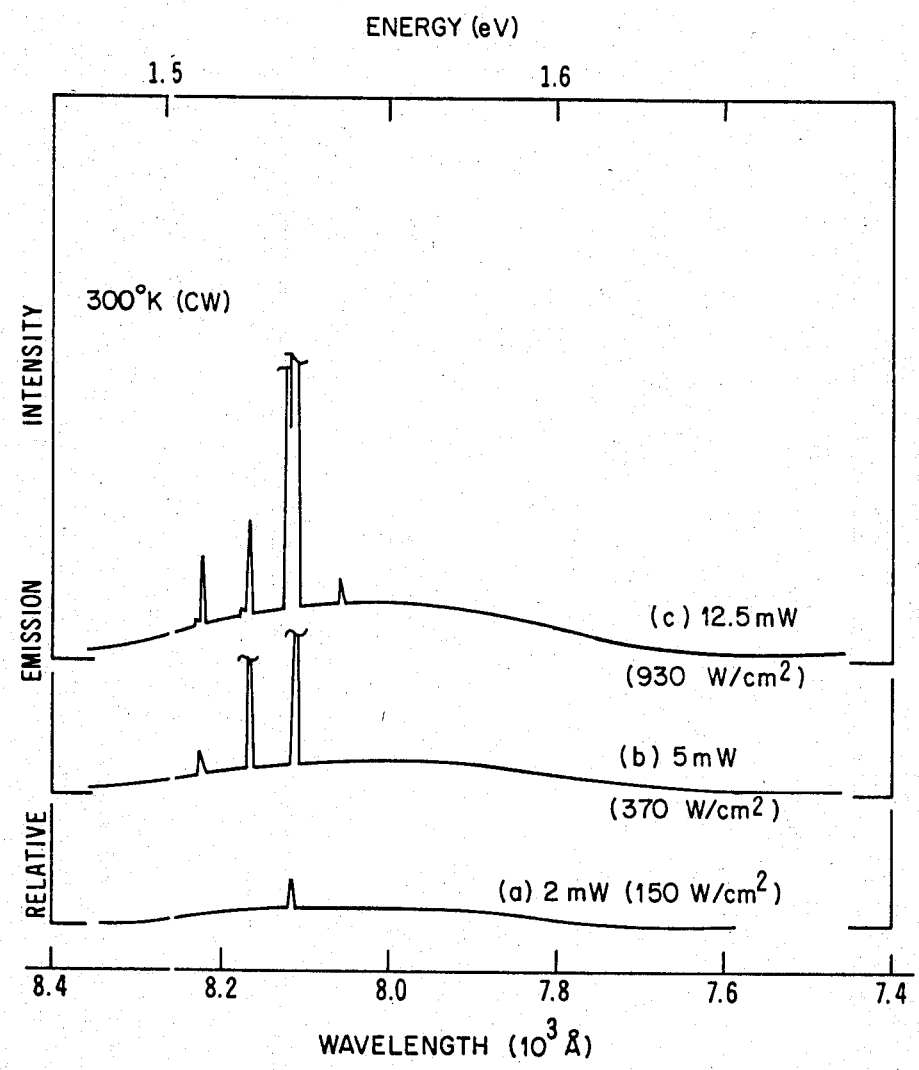
FIG. 2 is a graphic illustration of the emission intensity spectra for the asgrown photopumped laser of FIG. 1 for different applied power densities.

For the sake of comparison, FIG. 2 discloses parameters for a room temperature, CW photopumped laser operation of a sample single quantum well laser 10 prior to thermal annealing. Laser operation is observed at three different external photopumping power levels. Only about 72% of the external puming power is transmitted through the focusing optics and the diamond window to a spot size on the laser surface of about 35 $\mu$m in diameter providing a power density of about 150 W/cm$^2$.

The sample of FIG. 2 had a length and width dimension of 90 $\mu$m by 16 $\mu$m and was only partially pumped so that the sample had an equivalent pumping current, $I_{eq}$, equal to about 0.35 mA or equivalent current density of about 62 Å/cm$^2$. This equivalent current density is low and therefore indicative of low defect densities for the samples.

FIG. 2 illustrates three emission spectra curves (a), (b) and (c) for three different external pumping levels: (a) equal to 2 mW (150 W/cm$^2$), (b) equal to 5 mW (370 W/cm$^2$) and (c) equal to 12.5 mW (930 W/cm$^2$). As determined from the three curves, high pumping levels bring on an ever increasing number of lasing modes. The principal emission wavelength is about 8120 Å or $\hbar\omega$-$E_g$ (GaAs) equal to 104 meV. This is the predominant fundamental emission wavelength with secondary emission appearing or developing on increased photopumping.

Figure 4:
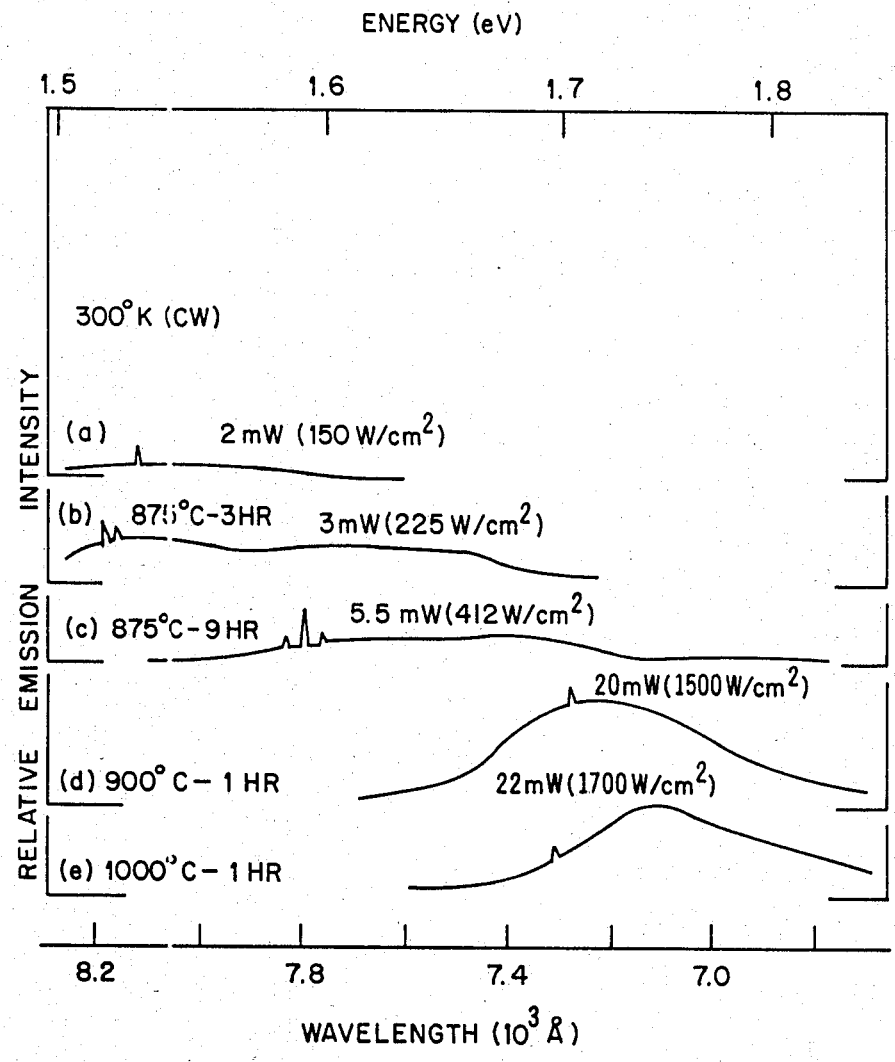
FIG. 4 is a graphic illustration of the emission spectra for a series of quantum well photopumped lasers of FIG. 1 thermally annealed at different temperatures and for different periods of time at different applied power densities.

In FIG. 4, the emission spectra curves are shown for CW room temperature operation of samples (b)–(e) after thermal annealing. The curve for sample (a) is a repeat of the as-grown sample pumped under condition (a) in FIG. 2. Sample (b) was annealed for three hours at 875° C.; sample (c) for nine hours at 875° C.; sample (d) for one hour at 900° C. and sample (e) for one hour at 1000° C.

The emission spectral curve for sample (b) as compared to sample (a) shows little or no wavelength shift or any substantial change in the threshold, the threshold being approximately 3 mW. Longer anneal times are required in order to effect a wavelength shift. In emission spectral curve (c), a wavelength shift to about 7810 Å is realized with an increase in threshold to 5.5 mW (412 w/cm$^2$).

At much higher temperatures, 900° C. for sample (d) and 1000° C. for sample (e), a much larger wavelength shift is experienced with about a ten times increase in threshold (respectively 20 mW and 22 mW), which is still low threshold, e.g. about 1700 W/cm$^2$ or $J_{eq}$ equal to about 700 A/cm$^2$ for CW operation.

The slight decrease in energy (eV) between samples (a) and (b) and between samples (d) and (e) in FIG. 4 is due to the complex dependence of the gain spectrum on excitation level, sample geometry, and the quality of the cleaved sample edges and not due to any inhomogeneity in the quantum well heterostructure crystal.

Figure 5:
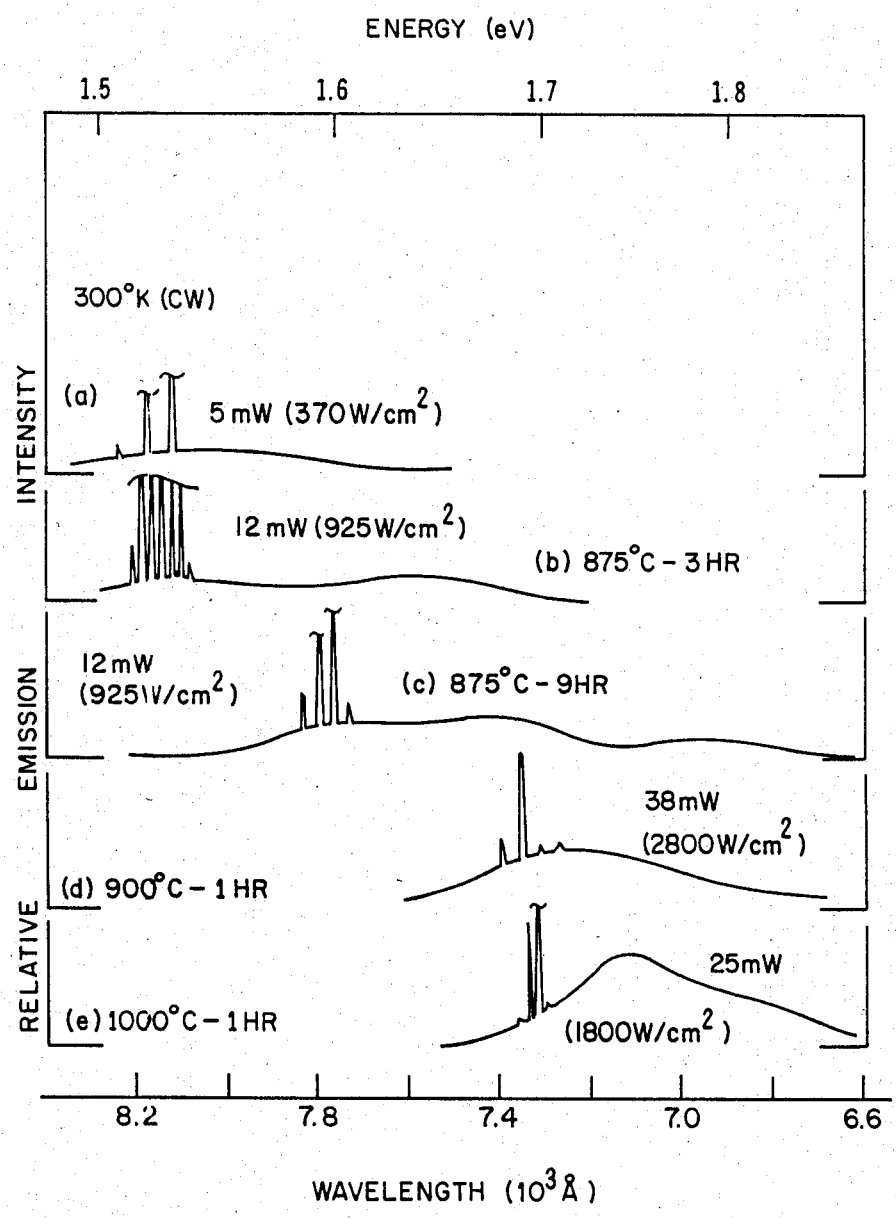
FIG. 5 is a graphic illustration of the emission spectra for the series of quantum well photopumped lasers of FIG. 4 but pumped at higher excitation levels.

FIG. 5 shows the emission spectra curves for CW operation at higher excitation levels for samples (a)–(e) of FIG. 4. Comparison of sample (a) with no anneal to sample (c) with an 875° C., nine hour anneal, there is a wavelength shift of about 120 Å.

Figure 6:
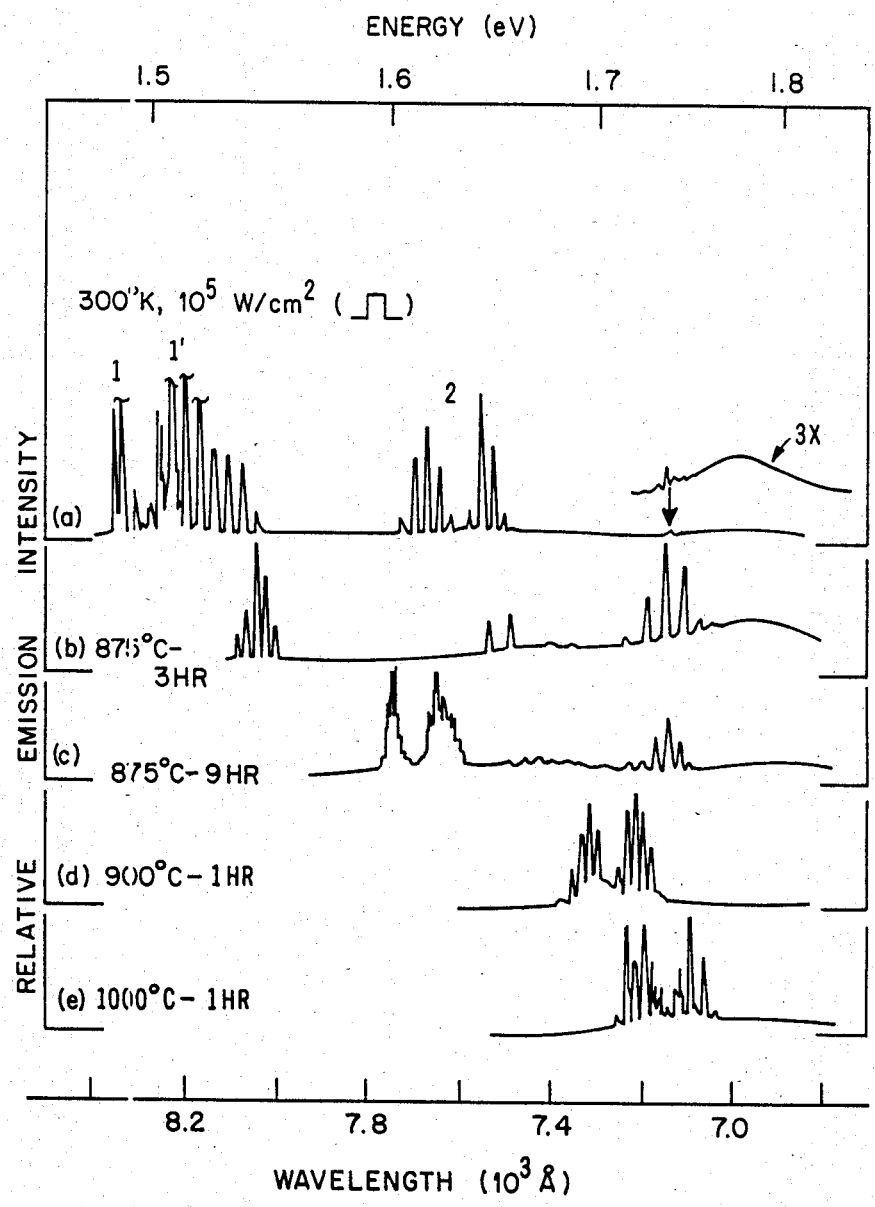
FIG. 6 is a graphic illustration of the emission spectra for the series of quantum well photopumped lasers of FIG. 4 but pulse pumped with high frequency pulses.

FIG. 6 shows the emission spectra curves for high level pulsed photopumped laser emission ($10^5$ W/cm$^2$) for samples (a)–(e) of FIG. 4. In FIG. 6, the emission spectra curve for sample (a) shows the n=1 electron-to-heavy hole (e→hh) transitions, n=1 electron-to-light hole (e→lh) transitions, the n=2 transitions, and, near the top of the well 13 as depicted in FIG. 3, the n=3 transitions. The spectral curves in FIG. 6 for samples (a), (b) and (c) illustrate the layer Ga-Al interdiffusion evolution of the GaAs square well 13 into a parabolic-like $Ga_{1-x}Al_xAl_xAs$ well 15. The n=1 (e→hh) and (e→lh) transitions for photon energy, $\hbar\omega$, are moved upwardly in energy (eV) more substantially than the n=2 transitions. As shown in FIG. 3, and corraborated in FIG. 6, the n=3 transitions have moved slightly down in energy (eV) but remain substantially near the top of the well 15.

The double set of spectral peaks for samples (c), (d) and (e) in FIG. 6 are associated with the n=1 transitions. In the case of the higher temperature annealed samples (d) and (e), it is possible that the double sets of spectral peaks are higher order transitions near the top of the well 15.

Figure 7:
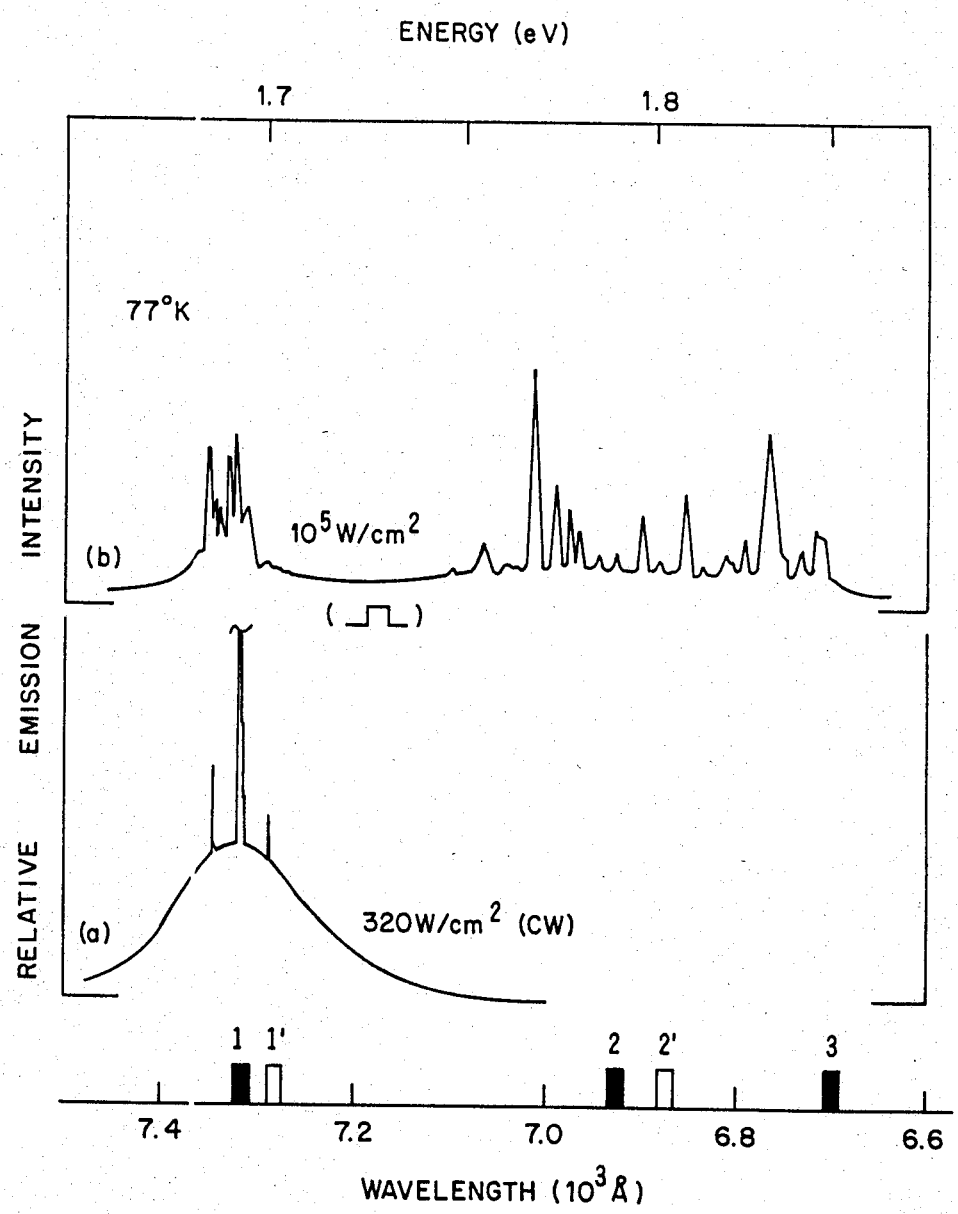
FIG. 7 is a graphic illustration of the emission spectra for a photopumped laser of FIG. 1 for continuous wave (CW) conditions, comprising curve (a), and high level pulsed conditions, comprising curve (b), illustrating differences in lasing transitions between these different pumping conditions.

Reference is now made to FIG. 7 showing the emission spectra curves for sample (c) of FIGS. 3–6 for CW 77° K. operation (320 W/cm$^2$), comprising curve (a), and for high level pulsed photopumped laser emission ($10^5$ W/cm$^2$) at 77° K., comprising curve (b). From these results, it can be determined that the sample (c) operates reasonably close to the calculated n=1,2 and 3 transitions determined by the following analysis.

The interdiffusion of Al from the $Ga_{1-x'}Al_{x'}As$ (x' approximately 0.3) waveguide regions of layers 14 and 16 into the GaAs quantum well 12, and conversely, Ga from the well 12 into the waveguide barriers 14 and 16 can be approximated as follows:

$$N(z,t) = N_o\{1 - (\tfrac{1}{2})[erf(h - z)/2\sqrt{Dt} + erf(h + z)/2\sqrt{Dt}]\}, \tag{Ia}$$

where $|z| < L_z/2$ $$N(z,t) = N_o\{1 - (\tfrac{1}{2})[erf(h - z)/2\sqrt{Dt} - erf(h + z)/2\sqrt{Dt}]\}, \tag{Ib}$$

where $|z| > L_z/2$ where the reference, z=0, is the center of the quantum well, h approximates $L_z/2$ and is approximately 37.5 Å and $N_o$ is the initial concentration of Al outside of the well, i.e., in the $Ga_{1-x'}Al_{x'}As$. The Al-Ga interdiffusion coefficient D, for x' equal about 0.3 $Ga_{1-x'}Al_{x'}As$ at a temperature of 875° C., has been determined as $8.7\times10^{-18}$ cm$^2$/s in the work of L. L. Chang, supra. This diffusion coefficient is used as a first iteration in the solution for the crystal composition and band edge profile in the modified quantum well 15, and then is improved with further calculation to agree with the photoluminescence data.

The Al interdiffusion profile in the center region of the quantum well laser 10 provides the new shape for the conduction and valence bands. Eighty-five percent of the energy band gap discontinuity, $\Delta E_c$, is assumed in the conduction band and the remainder in the valence band.

The exact solution to Schrödinger's equation for the diffusion-modified, energy band profile would be overly complicated and not worth while as a practical procedure for approximate analysis. Instead the new profile can be approximated by a modified Pöschl-Teller potential of the form:

$$V(z) = -(h^2/2m^*)\lambda(\lambda-1)(\alpha^2/\cos h^2 \alpha z), \quad (2)$$

where m* is the effective mass of the electrons, heavy-holes, or light-holes in the quantum well that is diffusion-modified by thermal annealing from a GaAs to an $Al_xGa_{1-x}As$ ($0 < x < 0.3$) well 13. In order for the potential to match the depth of the well $[V(z=0) = -\Delta E_{c,v}]$, the parameter $\lambda$ must be chosen to be $$\lambda = (\tfrac{1}{2}) + \{\tfrac{1}{4} + 2m^*\Delta E_{c,v}/(h^2\alpha^2)\}^{\tfrac{1}{2}} \quad (3)$$

The other parameter $\alpha$ must then be chosen to produce the closest fit between the potential as given by equation (2) and the experimental energy band profile after thermal annealing and Al-Ga interdiffusion. The energy levels of the modified Pöschl-Teller potential are given by:

$$E_n = -(h^2\alpha^2/2m^*)(\lambda - n)^2 \text{ where } n \leq \lambda, \quad (4)$$

where n is the index of the quantum level, $n = 1, 2, 3, \ldots$

If the recombination transitions for the diffusion-modified quantum well laser 10 are obtained, or at least approximated, from emission data on the annealed samples (c) of FIG. 7, the calculation procedure can be reversed to yield the diffusion coefficient. This has been done for the various thermal annealed samples (c) performed at 875° C. for nine hours and the Al-Ga interdiffusion coefficient D has been found to be D approximately $2.5 \times 10^{-18}$ cm$^2$/s.

As previously indicated, the comparison of the conduction and valence bands for the as-grown quantum well 13 in dotted line in FIG. 3 is made with the same well 15 in the solid lines after annealing as per sample (c). The small circles are the calculated points from the diffusion equation (1) with $D = 2.5 \times 10^{-18}$ cm$^2$/s and the solid curve is the fit from the modified Pöschl-Teller potential, equation (2), with $\alpha$ equal to 0.017 Å$^{-1}$. This data shows that with a sufficient thermal anneal, the continuum of energy states in the waveguide region comprising layers 12-16 will ascend to the top of the parabolic-like or funnel shaped well 15.

From an examination of data from FIG. 5, it can be seen that a reasonably minimal temperature for thermal annealing to shift the operating wavelength of the laser 10 is about 875° C. and annealing times of three to ten hours. Since no doping is involved in the waveguide region of laser 10, the emission wavelength shift taking place is not due to the influence of doping impurities. In this connection, a three hour anneal period results in little wavelength change whereas a nine hour anneal period produces a decrease in wavelength emission corresponding to an energy change, $\Delta E$, of about 70 meV. The change or shift can be made at higher annealing temperatures, e.g. 900° C. with shorter time periods, e.g. one hour corresponding to an energy change, $\Delta E$, of about 160 meV.

It should be pointed out that higher temperature annealing is generally less desirable in the presence of doping impurity profiles in the quantum well waveguide region of these lasers which may become diffused at such high temperatures. This problem, however, may be possibly alleviated by thermal pulse annealing as inferred from the application of thermal pulse annealing in the article of Asbeck et al., "Application of Thermal Pulse Annealing to Ion-Implanted GaAlAs/GAAs Heterojunction Bipolar Transistors", *IEEE Electron Device Letters*, Vol. EDL-4(4), pp. 81-84 (April, 1983).

3. Single and Multiple Quantum Well Heterostructure Lasers

Figure 8:
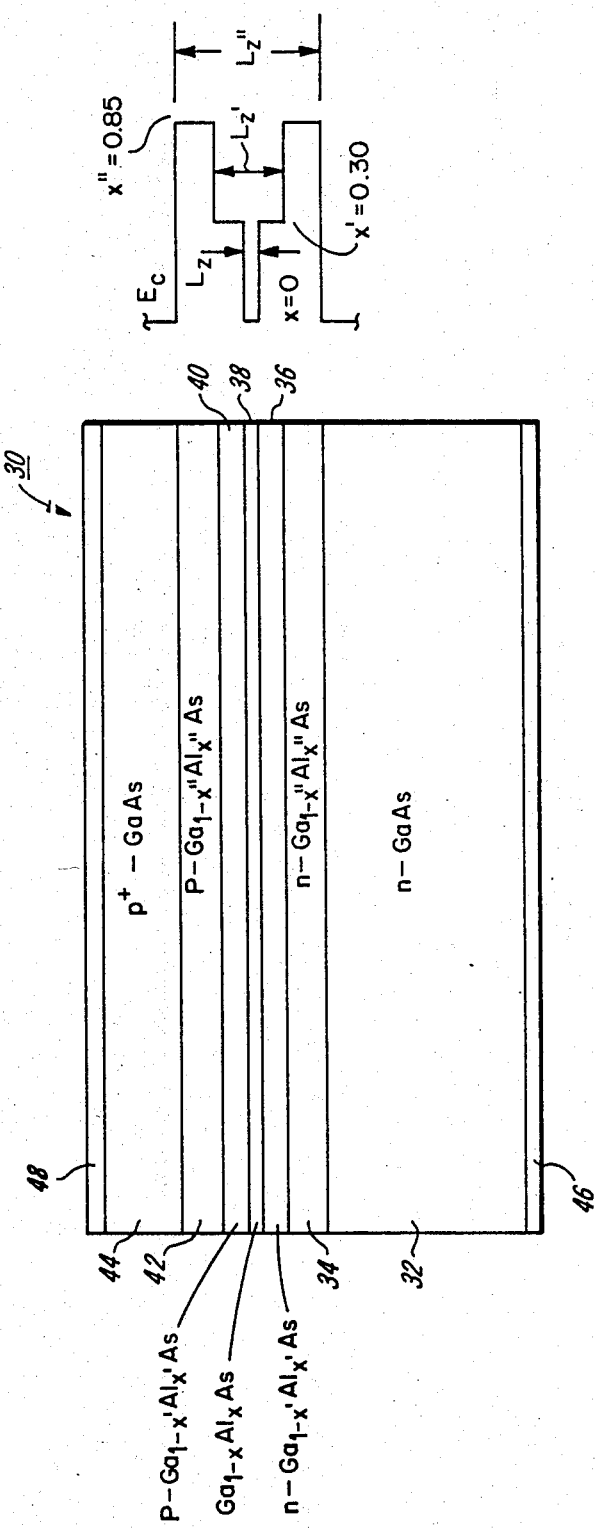
FIG. 8 is a cross-sectional view of a single quantum well heterostructure p-n junction current injection laser and accompanying energy band profile upon which thermal annealing techniques of this invention are to be applied.

Reference is now made to FIG. 8 wherein there is disclosed a stair step, single quantum well heterostructure injection laser 30. Laser 30 comprises a substrate 32 of n-GaAs upon which are consecutively deposited via MO-CVD, the following layers: outer cladding layer 34 of n-$Ga_{1-x''}Al_{x''}As$, cladding layer 36 of n-$Ga_{1-x'}Al_{x'}As$, quantum well active layer 38 of undoped $Ga_{1-x}Al_xAs$, cladding layer 40 of p-$Ga_{1-x'}Al_{x'}As$, outer cladding layer 42 of p-$Ga_{1-x''}Al_{x''}As$ and cap or contact layer 44 of p+ GaAs. Laser 30 has a bottom metal contact 46 and an upper contact 48 for application of current pumping to the laser. As shown by the accompanying energy band profile in FIG. 8, $L_z$ is equal to 60 Å to 80 Å, $L_z'$ is about 1300 Å and $L_z''$ is about 1.83 $\mu$m. Relative to the molar factor for x, x is equal to zero, x' is approximately 0.30 and x'' is approximately 0.85. It should be noted that the molar factor x' need not be identical for cladding layers 36 and 40. There may actually be a difference in value due to differences in their impurity profiles.

Outer cladding n-type layer 34 has a Se doping impurity concentration of approximately $5 \times 10^{17}$/cm$^3$ and is approximately 0.90 $\mu$m thick. Outer cladding p-type layer 42 has a Mg doping impurity concentration of approximately $5 \times 10^{17}$/cm$^3$ and is approximately 0.60 $\mu$m thick. The thicknesses are merely representative examples. These layers need only be thick enough to provide good optical waveguide confinement.

The thermal annealing technique of this invention is not limited to single quantum well lasers, such as illustrated in FIG. 8. FIGS. 11A-11D disclose other single and multiple well configurations that are applicable to the present invention. Variations of these profiles that may be also included are funnel shaped profile or multiple stair step profile established between the single or multiple quantum well structure selected and the outer cladding layers 34 and 42.

In each of the illustrations of FIG. 11, the quantum wells may typically be in the range of 40 Å-100 Å and chosen to achieve, as best as possible, the desired lasing wavelength. The molar factor x may be, for example, in the range of zero to 0.05, x' in the range of 0.15 to 0.35 and x'' in the range of 0.35 to 0.95. These are not ridged constraints in well design but are merely illustrative of present design considerations.

Figure 11A:
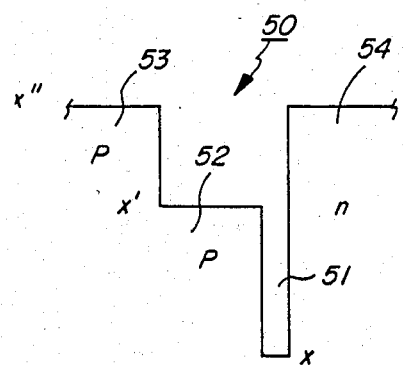
FIGS. 11A–11D are illustrative of the energy band profiles for single and multiple quantum well heterostructures applicable for the thermal annealing techniques of this invention.

FIG. 11A, discloses an energy band profile 50 with a single quantum well 51 comprising $Ga_{1-x}Al_xAs$ with a single p-type or undoped layer 52 of $Ga_{1-x'}Al_{x'}As$ functioning as carrier reservoir and waveguiding region. The outer cladding layers 53 and 54 are respectively p-type $Ga_{1-x''}Al_{x''}As$ and n-type $Ga_{1-x''}Al_{x''}As$.

Figure 11B:
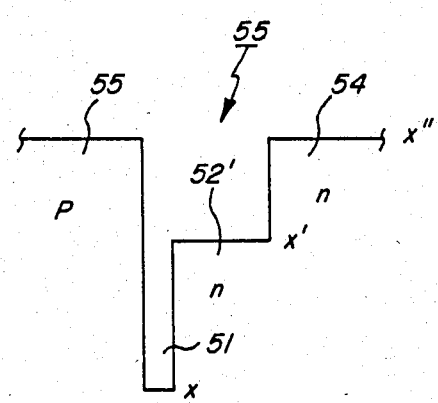

The energy band profile 55 of FIG. 11B is the converse of profile 50 wherein the single layer 52' is n-type or undoped $Ga_{1-x'}Al_{x'}As$ functioning as a carrier reservoir and waveguiding region.

Figure 11C:
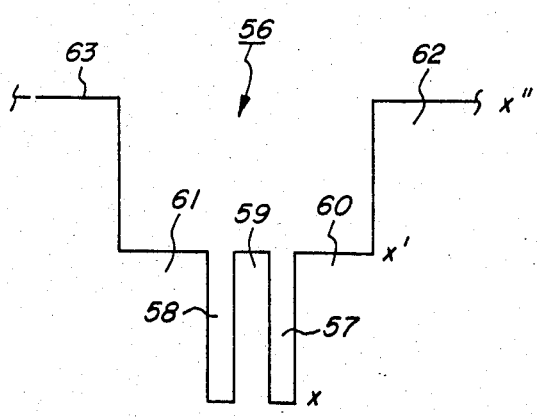
Figure 11D:
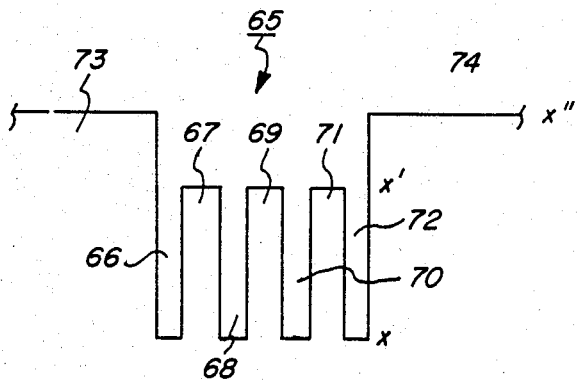

The energy band profiles of FIGS. 11C and 11D are for multiple well structures. In these structures, the p-n junction can be anywhere within the confines of the wells and barriers or sufficiently close to either end well to permit sufficient carrier injection and recombination. While the barrier layers of a multi-quantum well structure may be fairly thin, e.g., less than 80 Å, it is important to consider making the thickness of these barrier layers greater if thermal annealing of this invention is to be applied to the as-grown structures. The reason for this is to ensure that a sufficient amount of Al content is available in adjacent barrier layers for adequate interdiffusion into adjacent well regions in order to be able to ensure that a change in energy level will occur and, consequently, a broad range of shift in wavelength is possible. In such a case, the barriers may be materially thicker compared to the thickness of the wells.

Profile 56 in FIG. 11C represents a double quantum well structure comprising quantum well layers 57 and 58 of undoped $Ga_{1-x}Al_xAs$ separated by a barrier layer 59 of $Ga_{1-x'}Al_{x'}As$. Wells 57 and 58 may be, for example, in the range of 20 Å–100 Å thick and barrier layer in the range of 40 Å–150 Å thick as long as the barrier layers are sufficiently thick to insure good Ga-Al interdiffusion into the well layers. The outer confinement for layers 57 and 58 are layers 60 and 61 of $Ga_{1-x'}Al_{x'}As$ followed by further confinement layers 62 and 63 of $Ga_{1-x''}Al_{x''}As$.

Profile 65 in FIG. 11D represents a multi-quantum well structure comprising quantum well layers 66, 68, 70 and 72 comprising $Ga_{1-x}Al_xAs$, where x is about 0.05, and may each be in the range of 20 Å–100 Å thick. Barrier layers 67, 69 and 71 comprise $Ga_{1-x'}Al_{x'}As$, where x' is about 0.25, and may each be in the range of 40 Å–150 Å thick. Outer cladding layers 73 and 74 comprise $Ga_{1-x''}Al_{x''}As$, where x'' is in the range of about 0.35–0.95.

Comparing profile 65 with profile 56 of FIG. 11C, as additional wells are included, the outer confinement layers of $Ga_{1-x''}Al_{x''}As$ can be made thinner. Also, the thickness of the quantum well layers 66, 68, 70 and 72 may be made larger than the thickness of the barrier layers 67, 69 and 71 so long as the latter layers are sufficiently large to provide good Al content for purposes of interdiffusion into the adjacent well layers and effectively shift the energy levels of the quantum well layers 66, 68, 70 and 72 upon annealing.

4. Exemplifications of Thermal Annealing of Quantum Well Heterostructure Lasers

Thermal annealing of samples of single quantum well heterostructure lasers of the structure of laser 30 in FIG. 8 was carried out in a sealed and exhausted ampoule with an As overpressure environment to protect the samples from outdiffusion. The primary emission wavelength of the as-grown laser samples was 8260±10 Å, e.g., example 1 in Table I. The samples were annealed for the same time period, i.e., one hour, but at different anneal temperatures. The findings relative to the resultant lasing wavelength are shown in Table I.

TABLE I

| Sample (No.) | Anneal Time (Hrs) | Anneal Temp. (°C.) | Lasing Wavelength (±10Å) |
|---|---|---|---|
| 1 | 0 | — | 8260 |
| 2 | 1 | 800 | 8260 |
| 3 | 1 | 850 | 8260 |
| 4 | 1 | 900 | 7350 |
| 5 | 1 | 950 | 7300 |
| 6 | 1 | 1000 | 7060 |

Several other samples were annealed at the same temperature, i.e., 875° C., but for different time periods. The findings relative to the resultant lasing wavelength are shown in Table II.

TABLE II

| Sample (No.) | Anneal Time (Hrs) | Anneal Temp. (°C.) | Lasing Wavelength (±10Å) |
|---|---|---|---|
| 7 | 1 | 875 | 8200 |
| 8 | 3 | 875 | 8050 |
| 9 | 9 | 875 | 7800 |

While alloy disordering can be achieved by performing thermal annealing on quantum well structures with an As overpressure at high temperatures (L. L. Chang, supra), alloy disordering does not significantly or effectively degrade the optical performance of the laser structure or its material. This is supported by the following further sample preparation and measurements.

An as-grown wafer having the structural design shown for laser 30 in FIG. 8 was prepared by conventional processing employing MO-CVD. The wafer was then broken up into several components. One of these components was thermally annealed in an evacuated quartz ampoule with an overpressure of As at 875° C. for eight hours. A second and third component of the wafer were annealed at 900° C. for eight hours.

After thermal annealing, each wafer component was further treated as follows. A Zn diffusion at 600° C. for 10 minutes was performed on the p-type cap layer 44 simply to ensure that this layer was sufficiently doped for application of ohmic contacts. The wafer was then lapped and polished from the substrate side to a thickness of about 100–125 μm. The wafer components were then metallized for current pumping. No stripe geometry was employed, although this would be perfectly feasible. The contacts were prepared for broad area pumping. A metalization comprising 100 Å of Au plus 500 Å of Cr plus 1000 Å of Au was vapor deposited on cap layer 44. A metalization comprising 100 Å of Au plus 400 Å of Cr plus 1000 Å of Au was deposited on the bottom surface of substrate 46. The wafer components were then heated for 300° C. for 10 seconds in a hydrogen atmosphere to homogenize the contact layers. The wafer components were then cleaved and sawed into 250 μm by 250 μm dice, and one dice from each wafer component was mounted on an appropriate header.

Also prepared in the same manner with the above mentioned metalization contacts from the same wafer was an as-grown laser from a wafer component not thermally annealed. The principal emission wavelength of the as-grown laser was 8180 Å.

Figure 9:
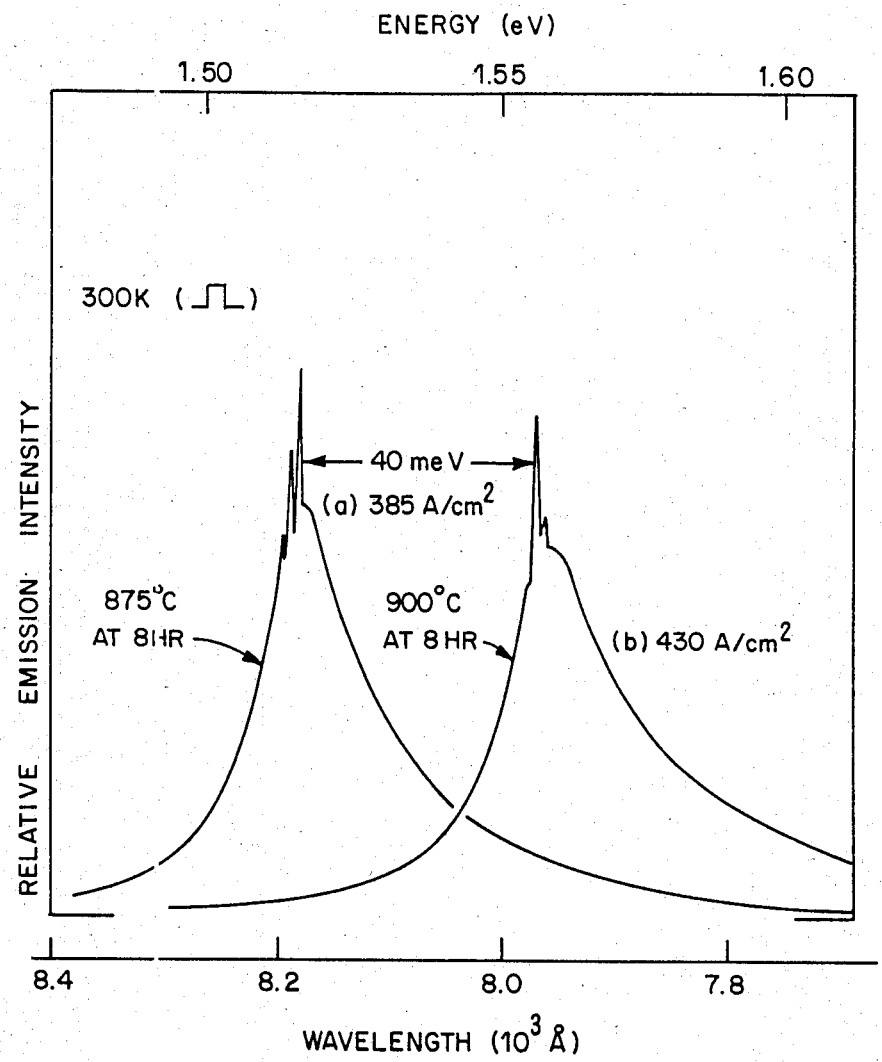
FIG. 9 is a graphic illustration of the emission spectra after thermal annealing for lasers of the FIG. 8 configuration from the same as-grown wafer.

FIG. 9 shows the spectral emission curve (a) for the laser prepared from the wafer component annealed at 875° C. or eight hours and the spectral emission curve (b) for the laser prepared from the wafer component annealed at 900° C. for eight hours. The results show that there was no apparent wavelength shift for the laser with the spectral curve (a) having a wavelength of 8180 Å, which approximates the principal emission wavelength for the as-grown laser of this design without thermal annealing. However, for the case of the laser with the spectra curvel (b) and annealed for the same period of time but at 25° C. higher temperature, the wavelength shift from 8180 Å to 7970 Å occurred which represents a 40 meV difference in energy. The threshold current density increased from 385 A/cm$^2$ to 425 A/cm$^2$ which is not a significant or detrimental rise in threshold.

Figure 10:
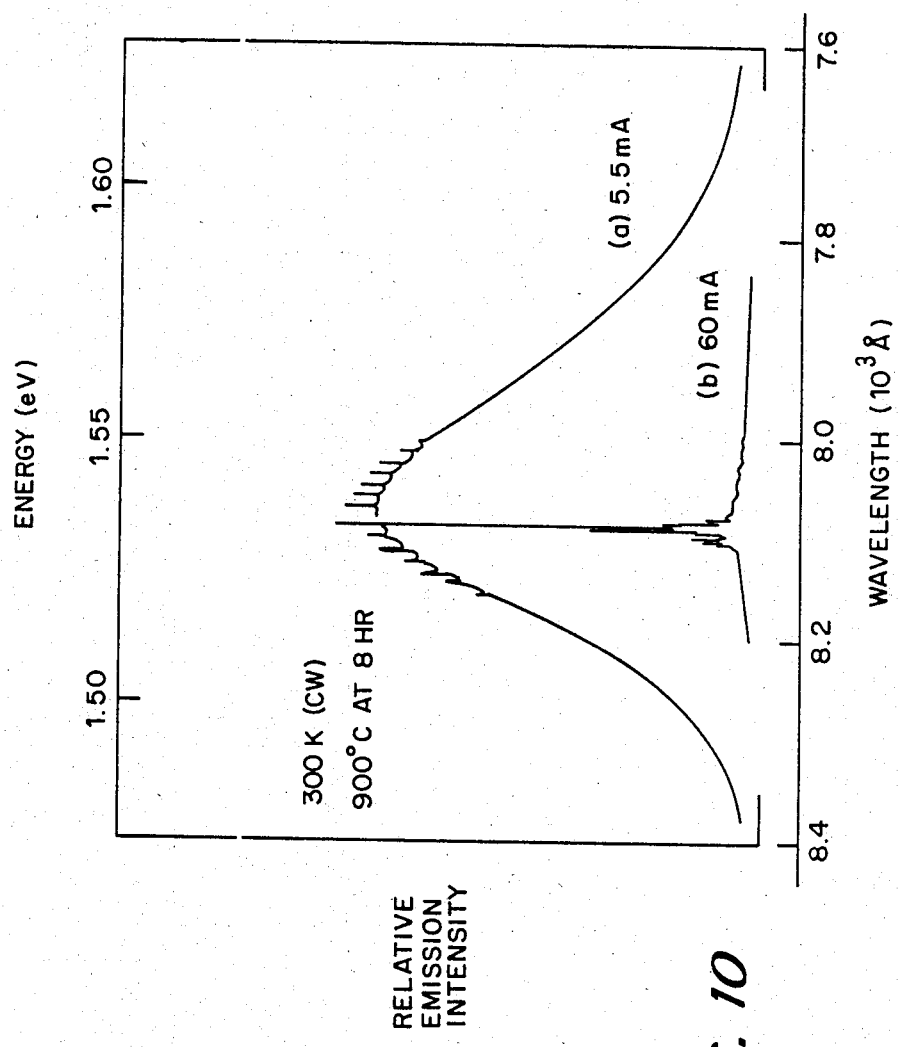
FIG. 10 is a graphic illustration of the emission spectra at different applied power densities after thermal annealing for another quantum well laser of the FIG. 8 configuration from the same as-grown wafer as those of FIG. 9 exhibiting a change in the emission wavelength sightly different compared to the FIG. 9 laser treated under the same conditions.

FIG. 10 shows the results of CW operation of another thermally annealed laser from the third wafer component annealed at 900° C. for eight hours. The results show the spontaneous emission spectral curve (a) at 5.5 mA of applied current with enhanced longitudinal modal pattern associated with the Fabry-Perot cavity indicative of very low absorption in the single well region. Curve (b) shows the spectral emission at 60 mA applied current above initial lasing threshold. To be noted is that the principal wavelength emission is about 8080 Å which is about 100 Å shorter wavelength as compared to the as-grown, non-annealed laser from the same wafer.

To be further noted is a slight shift to 8080 Å as compared to the laser of curve (b) of FIG. 9 with principal emission wavelength of 7970 Å. While these two laser structures were fabricated from the same wafer and have presumably undergone the same anneal conditions, i.e., 900° C. for eight hours, the differences in the resultant operating wavelength is primarily attributed to the variation in the reproducibility of annealing times and temperatures and also variations with quantum well thicknesses and composition thereof from sample to sample from the same wafer. These variations lead to a slight change to the Al-Ga interdiffusion of layers 36, 38 and 40 that will occur during annealing but provides a more significant shift in the resultant quantum well shape and corresponding change in the well energy as previously described in connection with FIG. 3.

5. Thermal Anneal of Quantum Well Lasers to Acceptable Wavelength Tolerances

The present technology for MO-CVD provides control of growth parameters, e.g., growth temperature, growth rate, doping, doping concentrations, gas flow rates, etc. However, in considering the interaction of these parameters and the slight variability that may occur among the parameters during a growth run, the best tolerance that one can generally hope for as to the resultant primary emission wavelength is about ±100 Å. The post thermal anneal treatment of this invention will permit tolerances obtainable within ±10 Å.

It is more feasible to employ an MO-CVD system that produces highly uniform epitaxial growths over a wafer or several wafers from a single growth run than attempt to replicate the same principal emission wavelength from one growth run to the next. Therefore, in order to provide large quantities of lasers for a particular application, e.g., for use in an optical disk recording and readout system, having an emission wavelength of 8100 Å±10 Å, MO-CVD processing would be designed to produce laser material with an emission wavelength of 8200 Å±100 Å. After wafer growth, the lasing wavelength can be determined for a small wafer portion which is examined and found to have very uniform growth characteristics, such as uniformity in layer thicknesses and doping profile. For purposes of discussion, assume that this portion has a uniform wavelength of 8230 Å, which is within the above-mentioned tolerance of ±100 Å. The wafer portion may then be thermally annealed for a prescribed time and temperature to shift the emission wavelength to meet the more stringent specification of 8100 Å±10 Å, e.g., 8105 Å.

In all previous examples, reference has been made to thermal annealing by application of heating to an ampoule in a furnace, i.e., furnace annealing. However, other forms of heating may provide better control over the heating of the sample, such as a heat transient technique, e.g., thermal pulse annealing. This type of annealing may typically subject the sample to several seconds, e.g., 1 to 60 seconds, of intense applied heat wherein the temperature rise of the sample is fairly linear in time during the period of heating. The sample cool down after the heating period is likewise fairly linear. This type of annealing has the advantages of possibly reducing or otherwise eliminating lattice damage, minimizing impurity diffusion, elimination of any temperature gradient effect across the sample during heat up, heating and cool down, and can be controlled "instantaneously" to remove and apply heat as necessary, as determined by temperature monitoring and primary emission wavelength determination. Primary emission wavelength determination may be accomplished with tunable dye laser by a sweep through the photopumped wavelength through the energy levels of the quantum well or wells to determine in fairly accurate manner the change in energy levels due to each thermal heat cycle.

Figure 12:
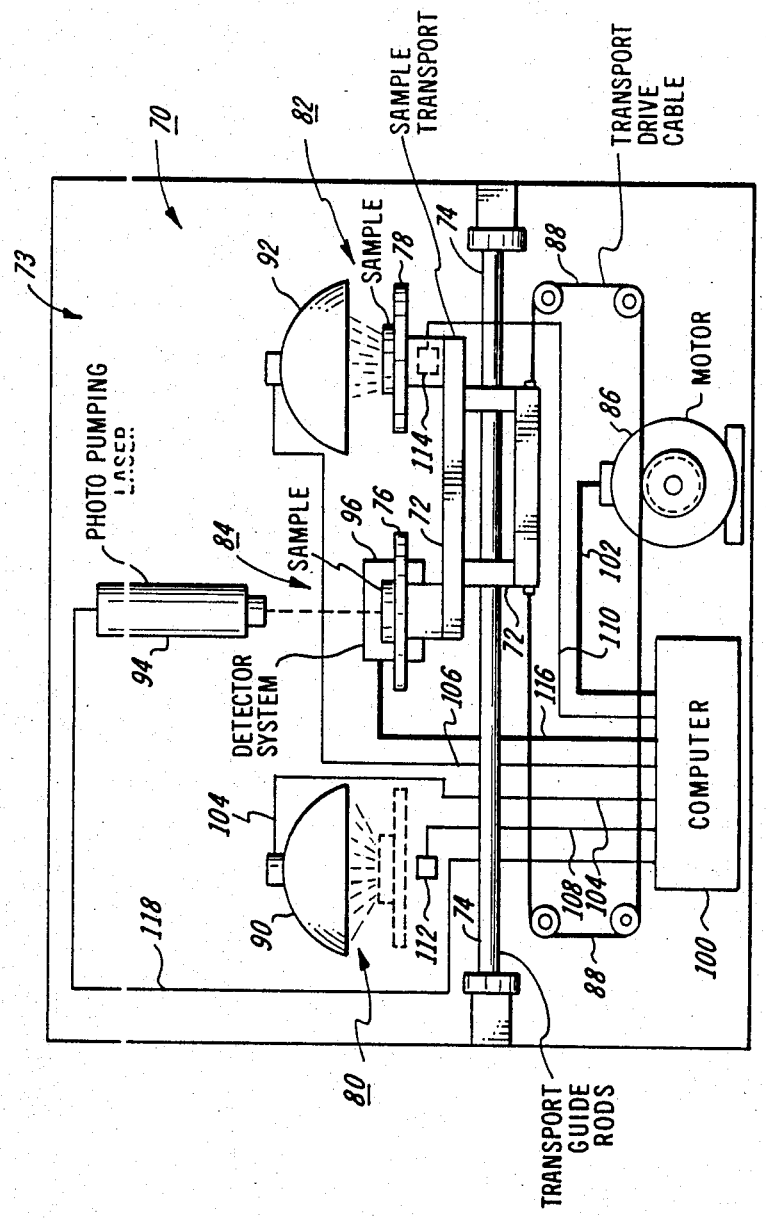
FIG. 12 is a wavelength tuning system that may be used in the practice of this invention.

As to how prescribed times and temperatures may be determined in the practice of this invention employing thermal annealing via heat transient technique, reference is made to FIG. 12 wherein is disclosed an example of means for wavelength tuning comprising wavelength tuning system 70. System 70 comprises a sample transport 72 which is supported for translational movement on transport guide rods 74. Transport 72 includes two sample support platforms 76 and 78. Wafer samples are shown positioned on platforms 76 and 78.

The chamber 73 of system 70 may be provided with an air, nitrogen or inert gas environment. Alternatively, As sources may be provided close to the wafer samples to receive the heat transient technique with the As gas applied only during heating of the samples. This type of environment would aid in preventing the outdiffusion of As from the samples. However, such as environment would be more complex to apply and control in a system such as system 70. A more confined enclosure for the wafer samples may be preferred, such as a quartz tube containing the sample into which the As gas is supplied and contained.

The samples may be individual as-grown wafer portions for later laser fabrication and which are later cleaved upon completion of the wavelength tuning task. The wafer samples may comprise, for example, the laser structure shown in FIG. 8 but without the metalization 46 and 48. A portion of the p$^+$ GaAs cap layer 44 would be removed by selective etching to provide a sample region for wavelength emission determination via photopumping. Since the cap layer 44 of P$^+$ GaAs would be too radiation absorbing of the pumping radiation and interfere with the photopumping of the sample for wavelength emission determination, the exposed portion of layer 42 of the sample is used exclusively for photopumping of the sample for purposes wavelength emission determination after thermal annealing of the sample or between successive annealing cycles of the sample.

Also, the entire surface, including both the surface of cap layer 44 and the now exposed portion of layer 42 of the sample, is covered with a protective layer of $Si_3N_4$. The $Si_3N_4$ protective layer may be deposited in situ during MO-CVD growth with a portion of the wafer surface having been masked during the growth of the final cap layer 44. The purpose of this protective layer is to prevent outdiffusion of As from the sample during thermal annealing in an air, nitrogen or inert gas environment. If an As environment is alternatively employed, the $Si_3N_4$ protective layer need not be provided on the surface of the sample.

If good ohmic contact can be achieved, a further alternative would be the provision of a cap layer 44 of $p^+$ GaAlAs, thereby side stepping the need for removal of a portion of the cap layer for purposes of photopumping.

Three stations or positions are shown in system 70. Two positions are pulse annealing stations 80 and 82 and the third is the testing station 84. Thus, the transport 74 is translated from left to right and right to left between the three stations 80, 82 and 84 so that in one position, sample platforms 76 and 78 are respectively at stations 84 and 82 (as shown in FIG. 12) and in the other position are respectively at stations 80 and 84. The movement of the sample transport 72 from one position to the other is carried out under the control of drive motor 86 and drive cable 88.

The thermal annealing sources illustrated in FIG. 12 are the incoherent light source type. At annealing station 80, the annealing source is high power incoherent light source 90 and at station 82, the annealing source is high power incoherent light source 92. These sources are capable of being energized to provide high temperature heating in a relatively short time, e.g., above 900° C. in less than a few seconds. Examples of such sources may be found in the articles of H. A. Bomke et al., "Annealing of Ion-Implanted Silicon by an Incoherent Light Pulse", *Applied Physics Letters*, Vo. 33(11) pp. 955–957 (Dec. 1, 1978) and Juh Tzeng Lue," Arc Annealing of $BF^+_2$ Implanted Silicon by a Short Pulse Flash Lamp", *Applied Physics Letters*, Vol. 36(1), pp. 73–76, (Jan. 1, 1980).

An alternative annealing source may be a graphic strip heater. Such a device is an integral part of the sample platforms 76 and 78 upon which the sample would be positioned. An example of such a source is found in the article of B.-Y. Tsaur et al., "Transient Annealing of Arsenic-Implanted Silicon Using a Graphic Strip Heater", *Applied Physics Letters*, Vol. 39(1), pp. 93–95 (July 1, 1981).

The testing station 84 includes an Argon photopumping laser or a tunable dye laser 94 focused to the sample prepositioned at the station for purposes of photopumping the sample to determine its emission spectra and primary emission wavelength by means of a detection system 96 which includes a monochrometer equipped with a photomultiplier aligned to receive the photopumped emission from the sample.

While three stations 80, 82 and 84 are shown in the illustration of the wavelength tuning system 70, it will be obvious to those skilled in the art that a single and combined annealing and testing station could be employed wherein the sample could be tested simultaneously with or after the application of the thermal pulse anneal, i.e., the photopumping laser and annealing source may be provided operate at a single station. Also, alternatively two separate stations may be employed rather than three, one station for annealing and the other for testing. Still further, a "lazy susan" sample transport may be employed in lieu of the linear transport 72 wherein a plurality of samples are supported about the peripheral region of the circular transport and adapted to pass each sample postion in a single rotational direction alternately from a thermal anneal position to a testing position.

The operation of system 70 is under the control of a general purpose digital computer 100. Computer 100 is connected via leads 102 to drive motor 86 and leads 104 and 106, to respectively operate thermal anneal sources 90 and 92. For monitoring, computer 100 is coupled via leads 108 and 100 respectively to thermocouples 112 and 114 to receive information as to the temperature status at annealing stations 80 and 82. Leads 116 are connected to detection system 96 from computer 100 to provide information as to the spontaneous emission spectra of the sample under examination and, in particular, the status of the primary emission wavelength from the sample. The photopumping laser 94 is connected to computer by lead 118 for controlling the laser photopumping activity.

System 70 functions as follows. Under the control of computer 100, the sample transport 72 is moved to the position as shown in FIG. 12 by operation of motor 86. Upon completion of this translation, computer 100 operates laser 94 to provide photopumping of the sample on platform 76 while monitoring the wavelength emission via detector system 96. Computer 100 also energizes source 92 for a predetermined period of time depending on the chosen rate, e.g., several seconds to several minutes to several hours, if necessary, wherein the temperature of the sample at platform 78 is raised, e.g., in excess of 850° C. to uniformly heat the sample. The temperature of the sample is monitored by computer 100 via thermcouple 114. After the predetermined anneal period has transpired, source 92 is extinguished and transport 72 is translated to the other position by means of motor 86. In this position, the sample on platform 78 will be positioned at testing station. Upon final positioning, computer 100 will next cause examination of the sample on platform 78 via laser 94 and detector system 96 to determine the primary wavelength emission from the sample. At the same time, computer 100 will energize source 90 to heat the sample on platform 76 for the prescribed period of time, monitoring the temperature of the sample via thermocouple 112, assuming however that this sample has not reached the desired emission wavelength within acceptable tolerances.

The foregoing process is continued wherein the computer 100 continually heats the samples for the prescribed period of time and tests the samples by comparing the value of the wavelength emission from each sample with a desired set value representing the desired emission wavelength. As the sample value becomes closer to the set value for a particular sample, computer 100, under program control, decreases the prescribed period of heating so as not to "overshoot" the set value. In this connection, the temperature of the annealing sources 90 and 92 may be maintained constant, as monitored by their respective thermocouplers 112 and 114, while the time period is gradually reduced as the determined emission wavelength value comes closer to the desired emission wavelength value. However, it is clear that the temperature may also either be increased or decreased in combination with a respective decrease or increase in the time period of heating under the control of computer 100 to accomplish this function.

After the prescribed set value for emission wavelength for one sample has been reached, examination and annealing for that sample is terminated by computer 100 while the process of annealing and testing continues for the other sample until the set value for emission wavelength is reached for the sample.

While the invention has been described in conjunction with specific embodiments, it is evident that many alternatives, modifications and variations will be apparent to those skilled in the art in light of the foregoing description. For example, another useful application where wavelength tuning may be very desirable, after crystal growth of the wafer has been achieved, is in the fabrication of distributed feedback (DFB) lasers and distributed Bragg reflector (DBR) lasers. It is difficult to fabricate DFB or DBR lasers that provide a respective DFB or DBR frequency matched with the peak of the spontaneous emission spectrum for the laser. This is because the peak of the spontaneous emission spectrum depends upon the ability to control many growth parameters during epitaxial fabrication. The post annealing technique as taught herein provides for a "second chance" to match the DFB or DBR frequency with the peak of the spontaneous emisiion spectrum from such lasers.

Accordingly, the invention is intended to embrace all such alternatives, modifications, and variations as fall within the spirit and scope of the appended claims.

What is claimed is:

1. The method of tuning the emission wavelength of a quantum well laser structure to a shorter emission wavelength comprising the steps of thermal annealing said structure and monitoring the emission wavelength thereof until the desired primary emission wavelength is achieved.

2. The method of claim 1 wherein the step of annealing is conducted in an elemental anti-outdiffusion environment.

3. The method of claim 1 wherein the rate of annealing is varied by changing the period of annealing and/or the temperature of annealing.

4. The method of claim 1 wherein said thermal annealing is carried out in a heating furnace.

5. The method of claim 1 wherein said thermal annealing comprise thermal pulse annealing.

6. The method of claim 2 wherein the rate of annealing is varied by changing of the overpressure of said environment.

7. The method of claim 2 wherein said quantum well structure comprises GaAs/GaAlAs regime, said environment comprises As.

8. The method of claim 2 wherein said quantum well structure comprises GaAs/GaAlAs regime, said elemental anti-outdiffusion environment is air, nitrogen or an inert gas.

9. The method of claim 3 wherein the time period of annealing is decreased as the emission wavelength of the structure nears the desired emission wavelength.

10. The method of claim 7 wherein said quantum well structure comprise a single quantum well laser.

11. The method of claim 7 wherein said quantum well structure comprise a multiple quantum well laser.

12. The method of claim 5 wherein said thermal pulse annealing is accomplished by either a high temperature incoherent light source or a graphic strip heater.

13. The method of tuning the emission wavelength of a quantum well laser structure to a set value for the emission wavelength comprising the steps of
    (1) heating the quantum well structure to a temperature sufficiently high to causally change the emission spectra of said laser structure due to interdiffusion changes at its quantum well(s) effectively changing the well energy levels thereof,
    (2) annealing the structure for a prescribed period of time at a predetermined temperature,
    (3) checking the emission spectra of the structure after termination of the annealing period to determine the primary emission wavelength of the structure,
    (4) comparing the determined value of the structure primary emission wavelength with the set value for the primary emission wavelength,
    (5) repetitively annealing the structure for said prescribed period of time at said predetermined temperature, checking the emission spectra of the structure after termination of each annealing period to determine the emission wavelength of the structure and comparing the determined value of the structure emission wavelength with the set value for the emission wavelength until the determine value approximates the set value for the primary emission wavelength.

14. The method of claim 13 wherein the step of annealing is conducted in an elemental anti-outdiffusion environment.

15. The method of claim 13 wherein the rate of annealing is varied by changing the period of annealing and/or the temperature of annealing.

16. The method of claim 13 wherein said annealing is carried out in a heating furnace.

17. The method of claim 13 wherein said annealing comprises thermal pulse annealing.

18. The method of claim 14 wherein the rate of annealing is varied by changing of the overpressure of said elemental anti-outdiffusion environment.

19. The method of claim 14 wherein said quantum well structure comprises GaAs/GaAlAs regime, said elemental anti-outdiffusion environment comprises As.

20. The method of claim 14 wherein said quantum well structure comprises GaAs/GaAlAs regime, said elemental anti-outdiffusion environment is air, nitrogen or an inert gas.

21. The method of claim 15 wherein the time period of annealing is decreased as the emission wavelength of the structure nears the desired emission wavelength.

22. The method of claim 19 wherein said quantum well structure comprises a single quantum laser.

23. The method of claim 19 wherein said quantum well structure comprises a multiple quantum well laser.

24. The method of claim 17 wherein said thermal pulse annealing is accomplished by either a high temperature incoherent light source as a graphic strip heater.

* * * * *